Sept. 8, 1964 W. WIEGMANN 3,148,085

METHOD AND APPARATUS FOR FABRICATING SEMICONDUCTOR DEVICES

Filed April 13, 1961 2 Sheets-Sheet 1

INVENTOR
W. WIEGMANN
BY H.W. Lockhart
ATTORNEY

METHOD AND APPARATUS FOR FABRICATING SEMICONDUCTOR DEVICES

Filed April 13, 1961

2 Sheets-Sheet 2

INVENTOR
W. WIEGMANN
BY H.W. Lockhart
ATTORNEY 3,148,085

METHOD AND APPARATUS FOR FABRICATING SEMICONDUCTOR DEVICES

William Wiegmann, Middlesex, N.J., assignor to Bell Telephone Laboratories, Incorporated, New York, N.Y., a corporation of New York Filed Apr. 13, 1961, Ser. No. 102,741
9 Claims. (Cl. 117—212)

This invention relates to the fabrication of semiconductor devices and, more particularly, to methods and apparatus for defining concentric circular and annular patterns of very small dimensions on the surfaces of semiconductor bodies.

The use of various patterns on the surfaces of semiconductor material is well known for defining limited regions for alloying and diffusion. One particularly desirable geometry for making both diodes and transistors involves an annular pattern which is difficult, if not impossible, to produce using a mask either against vapor deposition or by exposure of a photosensitive coating.

It is an object of this invention to improve the fabrication of semiconductor devices.

In particular, it is an object to simplify both the methods and means for producing annular patterns on semiconductor bodies. In this connection the method of this invention may be used to produce concentric annular and circular electrode patterns by metal deposition or annular and circular mask patterns by deposition of masking material or by controlled exposure to radition. Both of these forms of producing a pattern may be grouped within the generic expression "a pattern delineating source."

Typical apparatus for practicing this invention comprises a mask of suitable material having an array of equally spaced round holes therein. The mask is clamped close to, but spaced from, the surface of a slice of semiconductor material. This assembly of mask, spacer, and semiconductor then is mounted in a jig which enables rotation in the plane of both members about an axis perpendicular to the central point of the mask and slice. An evaporation source is placed a suitable distance from the mask and away from the axis of rotation. The evaporation source, for example, may be a small heater filament carrying a material such as silicon monoxide. The mask and slice assembly is rotated slowly and with the entire apparatus enclosed in a suitable container the heater filament is energized to vaporize the silicon monoxide. During the slow rotation of the assembly, with the vapor source fixed, the silicon monoxide will be deposited through the mask on the semiconductor surface in the form of an array of annular rings, one for each hole in the mask. In other words, as the jig rotates with the vapor source fixed, each hole in the mask will, in effect, trace out an annular ring of silicon monoxide from the offset source upon the surface of the semiconductor slice. Alternatively, the jig may be held fixed and the source can be moved around the axis of rotation to produce the same result. However, there are more complexities in this alternative apparatus arrangement.

If a circular dot is desired concentric with and spaced from an annular ring, as described above, a second vapor source placed on the axis of rotation of the assembly is employed. Such an arrangement is useful for depositing metallic electrodes on certain types of transistors. This basic arrangement may be used also for causing a radiation pattern of annular form to be traced out on a surface, for example, a photosensitive coating for enabling the development of an annular pattern in a respective coating.

Thus, a feature of this invention is the use of a rotating masking jig during exposure of a work surface to a source of vapor or radiation. In particular, the mask and work piece are rotated together in contrast to prior art arrangements in which either the mask alone or work piece alone is moved, one relative to the other to produce a shutter effect.

A better understanding of the invention and its other objects and features may be had from the following more detailed description taken in connection with the drawing in which.

Figure 1:
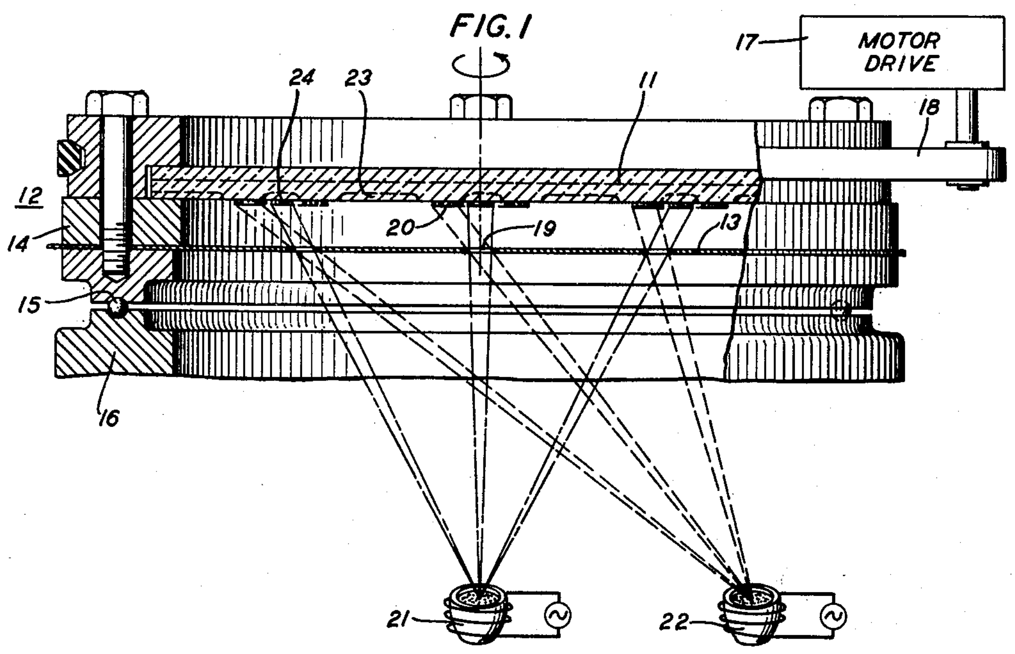
FIG. 1 is a schematic representation partially in section of apparatus for practicing one form of the invention.

FIG. 1 shows in schematic form the basic elements of the apparatus for carrying out the principle of this invention. A rectangular slice 11 of silicon semiconductor material containing previously diffused PN junctions is mounted as shown, by a simple clamping arrangement in the assembly jig 12. A perforated mask 13 which is separated from the silicon slice by a spacer 14 is also clamped in the jig. As shown in the schematic representation, this assembly jig 12 is rotatably mounted by a heat-resistant bearing 15, typically carbon, on a base member 16. Provision is made for a relatively slow rotation of this jig by a motor 17 driving through a belt 18. Various alternative schemes may be devised for mounting the perforated mask in close relation to the silicon slice and for providing means for rotating the jig. The arrangement shown in FIG. 1 has been adopted for ease of illustration.

In further explanation of the principles involved in this invention, two evaporation sources for the material to be deposited are shown schematically in the form of small crucibles with an electric heating element associated with each. One evaporation source 21 is shown on the axis of rotation of the assembly jig 12. The second evaporation source 22 is shown away from the axis of rotation but at substantially the same distance from the perforated mask. The metal mask, which typically may be of nickel, has nine small circular, equally spaced holes therethrough. In processes in which the temperature is changed between evaporations for alloying purposes, the mask may be of molybdenum which has substantially the same temperature coefficient of expansion as silicon. As the assembly jig 12 is slowly rotated these small holes determine the portions of the silicon surface upon which the evaporated material, particularly from the source 22, will be deposited.

In vapor deposition apparatus of the type shown in FIG. 1, the entire arrangement is advantageously enclosed in an evaporated chamber, not shown. Typically in the fabrication of a diffused junction transistor the slice of silicon has been previously subjected to two diffusion heat treatments to produce the N-type base region 23 and the several P-type emitter regions 24. In particular, as will be explained more fully later, the diffused emitter regions may be accurately defined using the principles of this invention. However, for the purposes of this portion of the explanation, it is assumed that the slice already contains the diffused base and emitter regions and, as mounted in the jig, is ready to receive the metallic electrodes for contacting the base and emitter regions.

The chamber housing the apparatus is purged and evacuated, typically to about $1 \times 10^{-6}$ millimeters of mercury, in accordance with techniques well known in the art. The first evaporation source 21 is energized and material from this source, typically aluminum, deposits through the holes in the mask to produce an array of circular dots on the silicon surface. Thus, each hole in the mask defines a column of vapor from the first source 21 which impinges on the silicon surface in a circular pattern. It can be understood readily that the hole 19 in the mask which is on the axis of rotation produces a circular dot because the source 21, the hole 19, and the deposited dot of material are all on the axis of rotation. Similarly, where the distance between the source and the mask is great compared to both the spacing between the mask and semiconductor surface and between the central hole and the off center holes, circular dots of deposited aluminum will be produced also by these off-center holes in the mask.

Upon completion of the aluminum deposition and without changing the pressure within the housing, the second evaporation source 22 is energized and the assembly jig 12 now is rotated slowly at a rate of from 10 to 20 revolutions per minute. The material from source 22, typically gold and a small proportion of antimony (0.5–1.0 percent), is deposited, as the jig rotates, in an array of annular rings, concentric with the previously deposited aluminum dots. The formation of this ring may be best understood by considering the formation of the centralmost ring 20 which is concentric with the axis of rotation. As the assembly jig 12 rotates, the material from the off-center evaporation source 22 deposits on an annular area 20 concentric with the central dot. Although somewhat more difficult to visualize, a similar annular deposition is produced concentric with each of the other circular dots by vapor collimation through the other holes in the mask.

Figure 2:
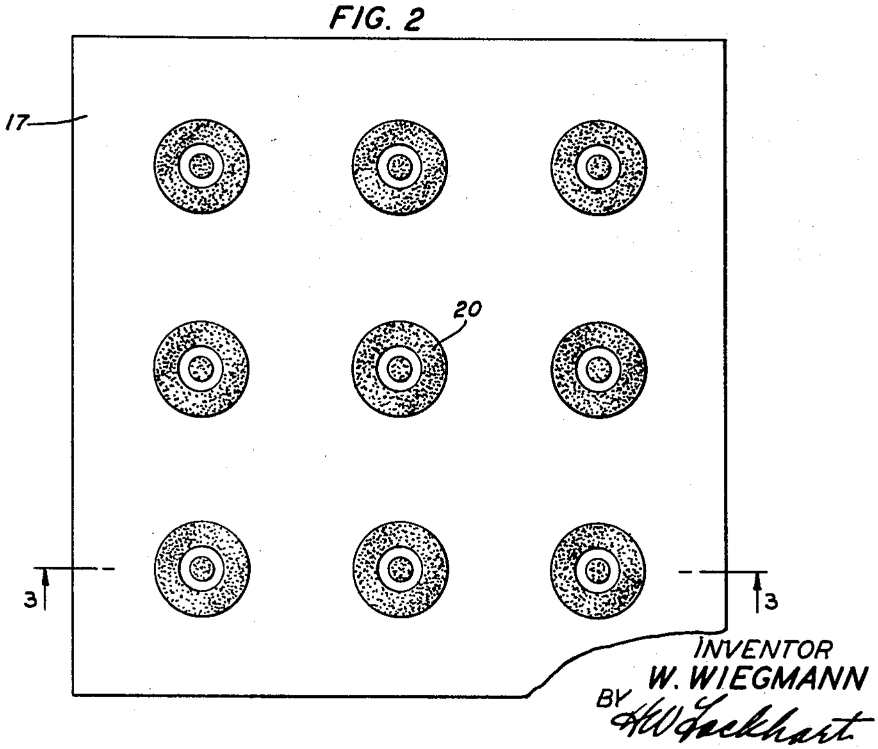
FIG. 2 is a plan view of a slice of semiconductor material with patterns on the surface produced by the apparatus of FIG. 1.
Figure 3:
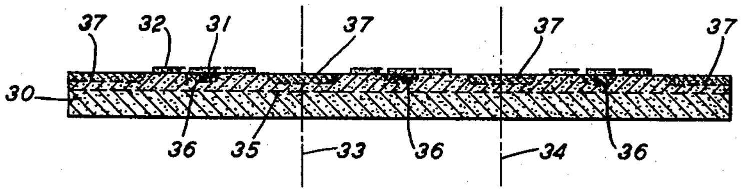
FIG. 3 is a sectional view taken through the semiconductor slice of FIG. 2.

The time required for depositing the ring-and-dot pattern is largely dependent upon the need to evaporate a relatively large quantity of material for the ring contact. That this is so can be appreciated by considering that only a small portion of each ring is in line with the source at a given time whereas the source for the central dot is exposed to the entire dot throughout the evaporation process. Typically, to provide a ring contact of a gold-antimony alloy having a thickness of 1000 Angstroms, an evaporation period of about 20 minutes is required. The dot pattern, however, may be produced in comparable thickness in a period of less than five minutes. The structure produced by the process just described is shown in FIGS. 2 and 3. Although an array of nine contact patterns is shown, a greater number may be produced by providing additional perforations in the mask or by altering the size of the mask and the work piece. Moreover, other variations of this technique are obvious such as providing simply a single offset evaporation source to produce only the annular ring or a third evaporation source can be added at a greater distance from the axis of rotation to produce another annular concentric region outside of the one shown in FIG. 2.

Figure 4:
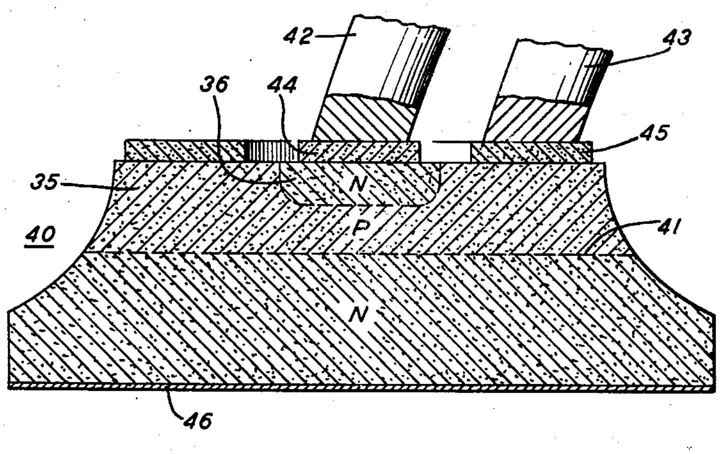
FIG. 4 is a sectional view of the transistor formed from a portion of the semiconductor slice shown in FIGS. 2 and 3.

Referring particularly to FIG. 3, the slice 30 is heated for a short time to alloy the deposited metal electrodes 31 and 32 slightly into the semiconductor material. Alternatively, the alloying heat treatment may be done at the conclusion of each deposition without "breaking vacuum." The slice 30 of semiconductor material then is divided as indicated by the broken lines 33 and 34 into individual wafers for fabrication into transistors as shown in FIG. 4. As shown therein, the wafer 40 is etched to reduce the area of the collector junction 41 and wire leads 42 and 43 are attached to both the emitter electrode 44 and the base electrode 45. The bottom of the wafer is plated typically with a gold layer 46 for mounting in electrical connection to a header.

Some appreciation of the precision of the process in accordance with this invention may be had from a consideration of typical dimensions. The silicon slice may be 0.4 to 0.5 of an inch on a side. The spacer between the silicon slice and the mask has a thickness of 5 mils (.005 inch) and the holes in the mask may range in diameter from 0.9 to 1.1 mils. The evaporation sources are positioned about 2.75 inches from the mask and the spacing between the holes in the mask is approximately 0.1 of an inch. In one typical arrangment the off-center evaporation source was located slightly less than 1.0 inch from the axis of rotation. This arrangement produced a ring-and-dot pattern in which the dots had a diameter of slightly greater than 1 mil and the diameter of the outer circumference of the ring contact was approximately 4.5 mils. The spacing between the ring and dot was about 0.6 mil. It is important in achieving accurate patterns to maintain a uniform dimension between the mask and the silicon surface, particularly for the dimensions mentioned above. The mask to slice distance should not vary more than 0.2 of a mil in order to avoid variations no larger than 0.1 of a mil in the spacing of the ring-and-dot pattern across the entire array.

Further, in connection with the fabrication of the double diffused transistors described above, the preliminary treatment of the silicon slice referred to hereinbefore comprises first a diffusion of a P-type impurity such as boron into one face of the N-type conductivity slice to produce the P-type base region 35 as seen in FIG. 4. A thermally grown oxide is then formed on the P-type surface of the slice, and this oxide is further coated with a photo-sensitive resist material. These steps are generally in accordance with the procedure disclosed in the application of J. Andrus, Serial No. 678,411, filed August 15, 1957, now abandoned. The slice then is placed coated face down in the apparatus of FIG. 1, substituting however, an ultraviolet source in the same general location as the gold-antimony evaporation source 22 which is to be used later. Specifically, the ultraviolet source first is placed at a position at the same distance from the mask as the evaporation sources but at a slightly lesser distance from the axis of rotation than the source 22. The light source is energized and the jig is rotated to expose portions of the resist-coated surface corresponding to an array of annular areas. The light source is then shifted to a position at a slightly greater distance from the axis of rotation, and the process is repeated. Thus, there is produced an exposed array of annular areas which are slightly greater in extent than the deposited areas subsequently produced by the evaporation source 22. It should be apparent that an alternative procedure to that of moving the light source from one position to another would be to provide an angular displacement of the assembly jig 12 between exposures.

After removal from the jig the semiconductor slice is treated further in accordance with the general techniques disclosed in the above-identified application so as to remove the photo resist coating except over the developed annular areas. An etching step then removes the oxide from these exposed areas after which the developed resist material may be washed away. The semiconductor slice then has a surface containing an array of oxide-masked annular areas which then is exposed to a phosphorus diffusion heat treatment which converts the exposed surface portions to N-type conductivity and produces the emitter regions 36 shown in FIGS. 3 and 4. The intervening diffused surface portions 37 are not a part of the final device structure and are removed by the etching operation which produces the mesa structure.

After this diffusion step and surface cleaning, the slice then is ready for the deposition of metallic electrodes described hereinbefore. It will be appreciated that by using the same apparatus with the deposition and radiation sources at related locations certain problems of mask registration are avoided.

Finally, the apparatus of FIG. 1 may be used to deposit an annular ring of a masking material. For example, the second evaporation source 22 may comprise a filament for vaporizing a silicon monoxide. With this as the sole source of deposition material there will be deposited on the surface of the silicon slice a small ring of oxide which may be used specifically as a mask for alloying into the silicon material to produce rectifying PN junctions of limited cross sectional areas such as are particularly suitable for fabrication of tunnel diodes.

Although the invention has been described in terms of certain specific embodiments, it will be understood that other arrangements may be devised by those skilled in the art which likewise will be within the scope and spirit of this invention.

What is claimed is:

1. In a method of producing a material pattern on a surface, the steps of positioning a mask having perforations therethrough close to but spaced from said surface, rotating said mask and said surface together about an axis of rotation substantially perpendicular to said surface, and exposing said mask to at least one pattern delineating source during rotation.

2. A method in accordance with claim 1 in which said pattern delineating source comprises means for vapor deposition of material.

3. A method in accordance with claim 1 in which said pattern delineating source comprises radiation means.

4. In a method of delineating a material pattern on a semiconductor surface, the steps of positioning a mask having a plurality of perforations therethrough close to but spaced from said surface, rotating said mask and said surface together about an axis of rotation substantially perpendicular to said surface, directing material from a finite source at said surface through said perforations.

5. In a method of producing a material pattern on the surface of a semiconductor body, steps of positioning a perforated mask close to but spaced from said surface, rotating said mask and said surface together about an axis of rotation substantially perpendicular to said surface, directing material from two finite sources at said surface through said perforations, said sources being at substantially the same distance from said surface but at differing distances from said axis of rotation, whereby material is deposited on said surface in substantially identical patterns corresponding to each of said perforations, each pattern comprising separate and distinct areas from each of said sources.

6. The method in accordance with claim 5 in which one of said sources is positioned on the axis of rotation and the perforations are circular whereby the patterns produced are a dot and a concentric ring corresponding to each perforation.

7. In a method of producing a material pattern on the surface of a semiconductor body, the steps of coating said surface with a radiation-sensitive material, positioning a mask having a plurality of perforations therethrough close to but spaced from said surface, rotating said mask and said surface together at about an axis of rotation substantially perpendicular to said surface, exposing said mask to a radiation source thereby to produce an exposure pattern on said coated surface, and treating said surface to develop said exposure pattern.

8. Apparatus for fabricating a material pattern on the surface of a semiconductor body comprising a thin mask having a plurality of perforations therethrough for defining a pattern, means for mounting said mask close to but spaced from said surface, means for rotating said mask and said semiconductor body about an axis substantially perpendicular to the center of said mask, means for directing particles from at least one finite source at said mask during rotation thereof.

9. Apparatus for producing an array of concentric ring and dot material patterns on the surface of a semiconductor body comprising a thin metal mask selected from the group comprising nickel and molybdenum, said mask having an array of equispaced circular holes therethrough, means for clamping said mask in close substantially parallel, spaced-apart relation to said surface of said semiconductor body, means for rotating said mask and said body about an axis of rotation substantially perpendicular to the center of said mask and said surface, a first evaporation source for depositing a first material mounted on said axis of rotation, a second evaporation source for evaporating a second material mounted away from said axis of rotation and at substantially the same distance of said first source, said evaporation sources providing means for directing material from fixed finite sources at said mask during rotation of said mask and said semiconductor body.

References Cited in the file of this patent

UNITED STATES PATENTS

| | | |
|---|---|---|
| 1,725,395 | Fruwirth | Aug. 20, 1929 |
| 2,246,561 | Wheelan et al. | June 24, 1941 |
| 2,906,637 | Auphan | Sept. 29, 1959 |
| 2,906,648 | Kohl | Sept. 29, 1959 |
| 2,916,396 | Perrenod | Dec. 8, 1959 |
| 2,946,697 | Petro | July 26, 1960 |
| 3,003,873 | Zworykin | Oct. 10, 1961 |